United States Patent [19]

Chung et al.

[11] Patent Number: 5,251,140
[45] Date of Patent: Oct. 5, 1993

[54] E-BEAM CONTROL DATA COMPACTION SYSTEM AND METHOD

[75] Inventors: Virginia M. Chung, Pleasant Valley; Joseph B. Frei; James E. Stuart, both of Hopewell Junction, all of N.Y.

[73] Assignee: International Business Machines Corporation, Armonk, N.Y.

[21] Appl. No.: 736,654

[22] Filed: Jul. 26, 1991

[51] Int. Cl.⁵ .................. G06F 15/46; H01J 37/302
[52] U.S. Cl. ...................... 364/474.02; 364/490; 364/491; 250/492.2
[58] Field of Search ............... 364/474.02, 490, 491; 250/492.2

[56] References Cited

U.S. PATENT DOCUMENTS

| | | | |
|---|---|---|---|
| 3,956,635 | 3/1976 | Chang | 250/492 A |
| 4,147,937 | 4/1979 | Buelow et al. | 250/492 A |
| 4,259,724 | 3/1981 | Sugiyama | 364/491 |
| 4,291,231 | 9/1981 | Kawashima et al. | 250/492 A |
| 4,386,403 | 5/1983 | Hsieh et al. | 364/491 |
| 4,511,980 | 4/1985 | Watanabe | 364/491 |
| 4,532,598 | 5/1985 | Shibayama | 364/491 |
| 4,554,625 | 11/1985 | Otten | 364/148 |
| 4,586,141 | 4/1986 | Yasuda et al. | 364/490 |
| 4,717,644 | 1/1988 | Jones et al. | 430/296 |
| 4,718,019 | 1/1988 | Fillion et al. | 364/491 |
| 4,728,797 | 3/1988 | Gotou et al. | 250/492.3 |
| 4,748,132 | 5/1988 | Fukuzawa et al. | 437/25 |
| 4,789,945 | 12/1988 | Niijima | 364/490 |
| 4,820,928 | 4/1989 | Ooyama et al. | 250/492.2 |
| 4,878,177 | 10/1989 | Ikenaga et al. | 364/489 |
| 4,890,238 | 12/1989 | Klein et al. | 364/491 |
| 4,908,772 | 3/1990 | Chi | 364/491 |
| 4,914,304 | 4/1990 | Koyama | 250/492.2 |
| 5,159,201 | 10/1992 | Frei | 250/492.2 |

OTHER PUBLICATIONS

IBM TDB, vol. 21, No. 4, Sep. 1978, pp. 1680–1682, "Bit Image Pattern Filling Algorithm".
IBM TDB, vol. 27, No. 7A, Dec. 1984, pp. 3726–3727, "General-Purpose Pattern Generator for E-Beam Lithography".
IBM TDB, vol. 24, No. 11A, Apr. 1982, pp. 5681–5687, "Method and Apparatus to Provide Rapid Interpretation of Digital Source Information During Electron Beam Pattern Writing of Rectangular Shapes".
J. Vac. Science and Technology, vol. 19, No. 4, Nov.–Dec. 1981, pp. 988–992, "Advanced Pattern Data Processing Technique for Raster Scan Electron Beam Exposure System".
IBM J. Res. & Dev., vol. 24, No. 5, Sep. 1980, pp.

(List continued on next page.)

Primary Examiner—Jerry Smith
Assistant Examiner—Paul Gordon
Attorney, Agent, or Firm—Charles W. Peterson, Jr.

[57] ABSTRACT

A method of converting circuit design shapes into optimized numerical control (NC) data for controlling an electron beam (e-beam) exposure system. During post processing of a circuit design layout, shapes with angled edges are covered or filled with rectangles and triangular trapezoidal or paralellograms called FILLSHAPES. Whenever a FILLSHAPE is created, it is as close to the preferred size as possible to increase the likelihood of creating duplicate FILLSHAPEs. A proximity correction value which is calculated for an equivalent rectangle is applied to the FILLSHAPE. After proximity correction, groups of identical FILLSHAPES and User-Defined Macros (UDM's) are created. A summary record is generated for each group. A weight factor is calculated for each group and stored in the summary record. The summary records are sorted according to weight factor. A FILLSHAPE Defined Macro FDM) or UDM is stored in the e-beam tool's macro buffer in order of sorted summary record until every Defined Macro (DM) is stored in the macro buffer or the Macro buffer is full. When the design shapes are encoded in the pattern buffer, fill rectangles are encoded as NC data until a FILLSHAPE or Macro is encountered. The macro buffer is checked for a DM corresponding to the encountered FILLSHAPE or Macro.

45 Claims, 11 Drawing Sheets

OTHER PUBLICATIONS 537-544, "Proximity Correction Enhancements for 1-um Dense Circuits".

J. Vac. Science and Technology, vol. 16, No. 6, Nov.–Dec. 1979, pp. 1803–1808, "Data Compaction and Vector Scan E-Beam System Performance Using Novel Algorithm for Recognition of Pattern Steps and Repeats".

J. Vac. Science and Technology, vol. 7, No. 6, Nov.–Dec. 1989, pp. 1556–1560, "Proximity Effect Correction in Electron Beam Lithography".

J. Vac. Science and Technology, vol. 7, No. 6, Nov.–Dec. 1989, pp. 1524–1527, "Proximity Effect Correction of an Electron Beam Direct Writing System EX-7".

J. Vac. Science and Technology, vol. 6, No. 6, Nov.–Dec. 1988, pp. 2061–2065, "Integrated Data Conversion for the Electron Beam Exposure System".

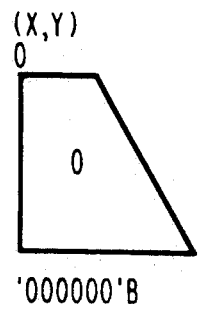
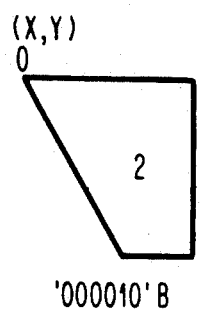
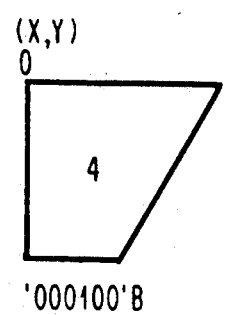
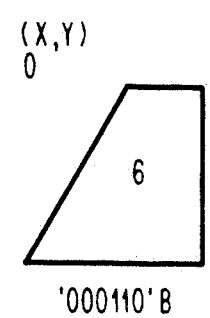
FIG. 3A   FIG. 3B   FIG. 3C   FIG. 3D
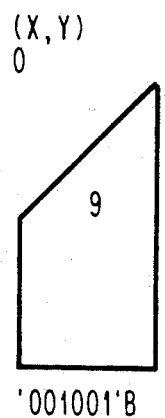
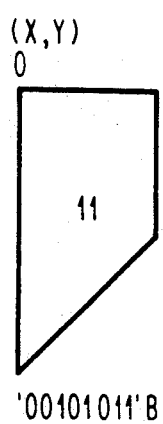
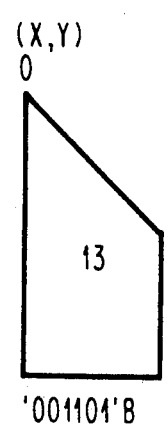
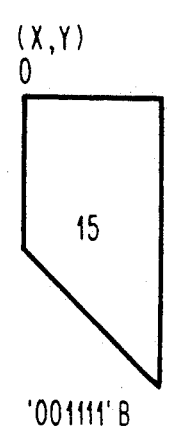
FIG. 3E   FIG. 3F   FIG. 3G   FIG. 3H
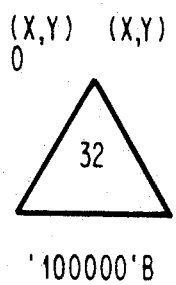
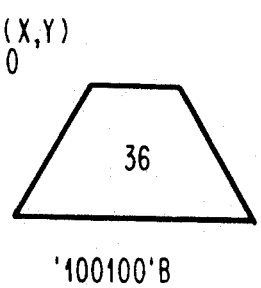
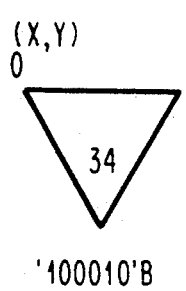
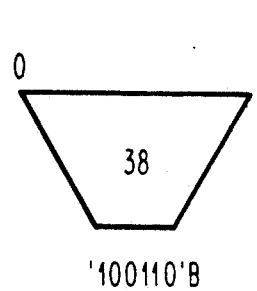
FIG. 3I   FIG. 3J   FIG. 3K   FIG. 3L (X,Y) 0

'101001'B (X,Y) 0

'101011'B (X,Y) 0

'101101'B (X,Y) 0

'101111'B (X,Y) 0

'010000'B (X,Y) 0

'010001'B (X,Y) (X,Y) 0 0

'010010'B

'010011'B (X,Y) 0

'110010'B (X,Y) 0

'110110'B (X,Y) 0

'111010'B (X,Y) 0

'111110'B

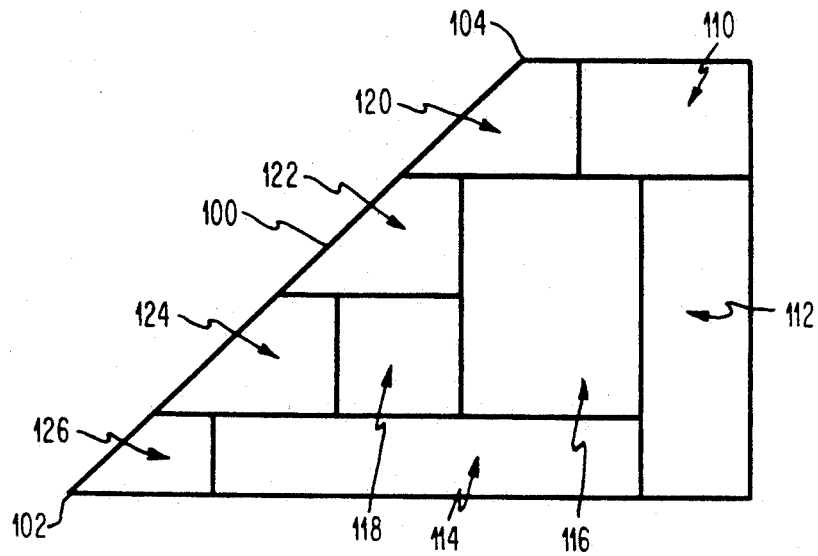

FIG. 4

```
BASED ON USER INPUT PARAMETERS DETERMINE THE MAXIMUM NUMBER
OF STAIRCASE STEPS (MAX_STEPS) THAT A FILLSHAPE WILL
CONTAIN.
DETERMINE THE NUMBER OF STAIRCASE STEPS ON AN INPUT EDGES
IF #STEPS <=MAX_STEPS THEN
      ONLY ONE FILLSHAPE IS PRODUCED
ELSE
      #FILLSHAPES = #STEPS / MAX_STEPS
      DETERMINE REMAINING STEPS
      IF REMAINING_STEPS <(MAX_STEPS -1) THEN
            #FILLSHAPES = FILLSHAPES -1
            SMALLER_FILLSHAPES = 2
      ELSE
            IF REMAINING_STEPS =(MAX_STEPS -1) THEN
                  SMALLER_FILLSHAPES =1
            ELSE
                  SMALLER_FILLSHAPES =0
            ENDIF
      ENDIF
      IF SMALLER_FILLSHAPES >0 THEN
            PLACE THE STAIRCASE STEPS WITH THE LARGER SIZE
            INTO THE SMALLER FILLSHAPES
         ELSE;
         ENDIF
      PLACE REMAINING STAIRCASE STEPS INTO #FILLSHAPES
ENDIF
```

FIG. 6

E-BEAM CONTROL DATA COMPACTION SYSTEM AND METHOD

RELATED APPLICATION

U.S. Pat. No. 5,159,201 to Frei "Shape Decomposition System Method" which was filed coincident with this application and, is assigned to the assignee of this invention, and is related to this application.

FIELD OF THE INVENTION

The present invention relates generally to the fabrication of integrated circuits and more particularly, to a method of lithographic patterning of radiation sensitive layers by an electron beam exposure system.

BACKGROUND OF THE INVENTION

Integrated circuit shapes can be patterned on a wafer entirely by means of direct writing electron beam (e-beam) lithography. Using e-beam to write microcircuit patterns in integrated circuit fabrication is well known in the art.

The intended pattern can be directly written onto a semiconductor wafer by exposing a thin layer of radiation sensitive material on the wafer with a beam of electrons or, alternatively, by using a mask made with an e-beam tool to optically expose a thin layer of photoresist on the semiconductor wafer. Whether the pattern is directly written or indirectly written with a mask, the e-beam tool control remains the same. See generally, U.S. Pat. No. 4,259,724 for an example of an e-beam lithography system for direct writing to expose an entire wafer. The use of a computer to generate control data and to control the e-beam is also well known. See U.S. Pat. No. 4,820,928 for an example of a computer controlled microcircuit fabrication system.

While e-beam lithography provides the advantage of very sharply defined patterns for very small geometric shapes, transferring those shapes from a computer designed shape to a physical image on a photoresistive, or radiation sensitive layer (resist), can be both expensive and time consuming. Most of the cost associated with transforming the shape is computer operating cost, which is also generally time dependent. Therefore, reducing computer operating time will reduce both the time and the expense associated with e-beam lithography. Several approaches have been used to reduce the time required to expose a wafer with an e-beam tool. See U.S. Pat. No. 4,147,937 for an example of a method and an apparatus for exposing a wafer by raster scan writing, i.e., a single line at a time. See also, U.S. Pat. No. 4,914,304 for an example of an e-beam exposure system that uses a shaped beam to improve exposure of different shapes. Although these prior art approaches reduce the exposure time, they do not appreciably reduce the computer time required to prepare a design shape for use on the e-beam tool. Using the prior art method of preparing or processing design shapes, it sometimes takes several hundreds of Central Processing Unit (CPU) minutes to convert an entire design into a format which may be used to control an e-beam tool. So, converting the graphics representation of a shape to control parameters for controlling the e-beam tool requires significant computer resources.

The flow diagram of FIG. 1 shows the steps typically taken in the prior art to convert design data into e-beam tool control data and expose a semiconductor wafer. Each design shape is represented (30) in a graphics language by lines, rectangles, circles, and polygons. Such a representation is characteristic of the particular graphics language used and the shape represented. The graphics representation of the shape must be converted to control signals for an e-beam tool. The e-beam tool uses the converted, or postprocessed, information to direct the electron beam onto the radiation sensitive layer, which writes, or exposes, the design shape onto the layer. A postprocessor is a computer program which combines the graphics data (30) and key e-beam tool processing parameters (32), also called keywords, to produce numerical control data for use by the e-beam lithographic exposure tool. Converting the design data to numerical control data is called postprocessing the design data. Numerical control data is the data used to control exposure of the radiation sensitive layer by the e-beam tool.

Before postprocessing the design data, the graphics language representation of the design data (30) and the keywords (32) are checked (34) for syntax errors. After verifying that there are no syntax errors, the postprocessor applies (40) keywords which describe shape compensation, known as etch biases, to the shapes. An etch bias is a compensation for the amount of distortion to a design shape which occurs in the process of making the final shape. Next the postprocessor transforms (42) the shapes from the graphics language grid (a unit of measure) to the e-beam tool grid.

After transforming the shapes into the tool grid, the postprocessor fills (44) the shapes. "Filling" is a term used to describe the process of reconstructing a shape out of one or more types of polygons, such as rectangles, so that the reconstructed shape is, as nearly as possible, identical to the design shape. When the E-beam tool cannot easily reproduce a portion of a shape, the fill becomes very complex. For example, an E-beam tool which was designed to expose rectangular areas might have problems exposing a shape with angled edges, edges at other than 90° to adjacent edges. Typically, a staircase of small rectangles are used to approximate the angled edge. Edge smoothness would be dependent on the size of the rise and run of the staircase steps, the smaller the steps the smoother the edge. However, the smaller the step, the higher the number of steps required to fill an edge and, consequently, the larger the volume of data generated for a fill (at least one rectangle generated for each step). Once the design shape has been reconstructed, it is said to be filled with fill polygons or fill rectangles. Prior art methods required that each shape be filled twice: once to fill the shape and a second time to determine if the first fill was optimum. See U.S. Pat. No. 4,554,625 for an example of a method of producing non-overlapping rectangles to fill an area. Prior art fill methods first partitioned a design shape into quadrilaterals in the first pass. A shape with an angled edge could be partitioned into non-uniform quadrilaterals with the angled edge being segmented into unequal segments. That partitioning could lead to lost uniformity of the angled edge and degraded image quality, if the staircase generated to cover the shape along the angled edge was unique in each segment. A uniform staircase along the full length of the angled edge would provide a uniform angled edge, whereas a non-uniform staircase would not.

The fill rectangles generated during the fill (44) provide the e-beam tool with control data to direct the e-beam to expose a rectangular area. See, "Method and Apparatus for Digital Control of E-Beam Pattern Writing as Applied to Subfield and Vector Equipment," in the March, 1980 IBM Technical Disclosure Bulletin page 4583, and see, "Method and Apparatus to Provide Rapid Interpretation of Digital Source Information During Electron-Beam Pattern Writing of Rectangular Shapes," in the April, 1982 IBM Technical Disclosure Bulletin page 5681, for examples of rectangle generators. For an example of how the fill rectangles are used to control the e-beam tool, U.S. Pat. No. 3,956,634 discloses a method of exposing a fill rectangle by an inward spiral, which starts by tracing the perimeter of the rectangle and spiralling the beam inward until the center of the rectangle is reached.

After the fill (44), overlapping fill rectangles are cut and the overlaps are eliminated (46). Overlaps occurred whenever a designer used two or more overlapping simple shapes to create a more complex shape. As a result of filling the simple shapes, the more complex shape is filled. However, the fill rectangles for the simple shapes overlapped wherever the simple shapes overlapped. The overlap can be eliminated by either combining the overlapping fill rectangles into a single fill rectangle, shrinking one of the overlapping fill rectangles, removing the overlapping fill rectangles and filling along the overlap, or by any other method which would result in butting fill rectangles filling the area within the complex shape. Once the fill rectangle overlaps are eliminated (46) the fill rectangles are proximity corrected (47).

Proximity effects are created by electrons being scattered while traveling to, from and in the resist. These scattered and reflected electrons partially expose the resist up to several micrometers from their intended point of impact (scattering radius) causing over exposure of surrounding shapes. Proximity correction (47) means adding control information to the fill rectangles to adjust the length of time which the E-beam exposes the resist. For example, a fill rectangle, when exposed, may cause interference with adjacent fill rectangles known as blooming. Blooming causes "fuzzy" edges and unintentionally filled notches because rectangles become "over-exposed". Blooming can be reduced by reducing beam exposure time for adjacent rectangles.

Proximity effects may be ignored for many rectangles, especially for most internal rectangles where rectangle edge definition is not important to the final shape. Generally, however, proximity effects are considered for every rectangle on a shape's edge within the scattering radius of other rectangles. The number of rectangles within the scattering radius of a staircase rectangle may be high because the staircase is many small rectangles placed in close proximity to each other.

Exposure time may also need to be adjusted for the size of the rectangle. In particular, very small rectangles may not print without increased exposure time, resulting in degraded image quality. Increasing e-beam exposure time would assure that small rectangles would print, but it would also assure that larger rectangles would be over exposed. Reducing exposure time uniformly to print large rectangles would exacerbate the problem of printing small rectangles. However, tailoring the exposure value for every rectangle increases the data volume and CPU time used in proximity correction (47). Consequently, calculating proximity correction values may require as much or more CPU time as filling the design shapes.

After proximity correction, the fill data is encoded and passed (48) to the e-beam tool as numerical control (NC) data. Numerical control data is actually a series of commands which provide control for the e-beam tool, directing the tool to expose the radiation sensitive layer in a determined set of steps at a determined exposure level. In encoding the fill data, fill rectangles are further reduced into one or more sub-areas called spots, each of which will be written by a vertical or horizontal raster scan. When the fill data is encoded as NC data, each fill rectangle is replaced by NC data which is encoded into the pattern buffer. The pattern buffer is storage where the NC data is held for use by the e-beam tool. The exposure level is the proximity corrected value from 47 and is part of this NC data.

After the design data is converted to NC data, the e-beam tool writes (50) the design onto a wafer by exposing each fill rectangle onto a radiation sensitive layer. Once every fill rectangle has been exposed the design shape will have been written onto the layer. The exposed pattern can be developed in a manner similar to photodeveloping. The wafer, covered by the developed pattern, is then etched, implanted or otherwise similarly altered to imprint the pattern onto the wafer. So, the NC data for the e-beam tool is encoded from the data generated in the fill (44) and proximity correction (47). Since, during the fill, the computer must treat every shape as a puzzle in which the computer must both create the pieces and then fit them together, the fill (44) often accounts for the most CPU time and may produce the largest volume of data. Because the pieces created in the fill must be examined and, when necessary, corrected for proximity effects, proximity correction (47) may account for more CPU time and produce more data than the fill (44).

A semiconductor chip, typically, is comprised of several layers of shapes, commonly known as levels, and which are overlaid to form micro circuits. In the prior art, when each of these layers was created optically through a mask, these layers were known as mask levels. Although some mask levels may still be made with an optical tool, a single design may also require several levels which must be independently converted to e-beam control data and, masks for some of the remaining levels may be created using the same e-beam tool. Both filling and proximity correcting each mask level are major CPU bottlenecks which may take several CPU hours each. The CPU utilization times tend to increase as a function of N**2, where N is the number of shape edges. Since each circuit is comprised of several design shapes, and since the number of edges is directly related to the number of design shapes, CPU thruput is related to the number of circuits in the design. If a design is sufficiently complex, the time required to fill a single mask level would exceed the average time between CPU failures, known as the CPU's mean time to fail. Thus, the number of circuits allowed on an integrated circuit chip could be limited by factors such as the CPU's mean time to fail rather than the e-beam tool's other physical limitations. This problem with filling is compounded by proximity correction requirements. Reducing the time required to fill a design would provide a significant improvement over slow prior art fill methods. Additional improvement can be realized by reducing proximity correction time. Also, data volume problems are compounded for a design having a significant number of angled edges.

A prior art approach to reducing data volume has been to add a data compaction subsystem called the macro buffer to the e-beam system. The macro buffer is a portion of the e-beam tool's storage, designated for storing NC data for repetitive patterns known as "User Defined Macros" (UDMs). A macro read command replaces every occurrence of the macro in the pattern buffer. When the e-beam tool encounters the macro read command, the tool retrieves the corresponding UDM from the macro buffer and executes the NC data on the UDM. The macro buffer takes advantage of the repetitive characteristic inherent in most designs. That repetitive characteristic results from a basic precept of logic design that any logic function can be implemented in NOR gates (or NAND gates). Designers follow this basic precept by limiting the number of unique circuits they create in designing a complex integrated circuit chip. Even on a very complex chip, the number of unique circuits may be less than 100. Usually each circuit is created once ("laid out") as a cell. That cell is repeated as a UDM each time a set of shapes comprising the cell is required. By maintaining the design's nesting (reusing macros), each cell is filled once and the UDM placed in the macro buffer. Whenever the e-beam tool is to write the cell, the UDM is recalled from the Macro buffer. For a chip such as a 1 Mbit Random Access Memory (RAM), storing a command to call the UDM containing the RAM memory cell macro one million times would use much less memory than storing one million occurrences each of all rectangles used to fill the RAM cell. Thus, the macro buffer provided a significant data compaction advantage.

However, in the prior art, only UDMs were stored in the macro buffer, which still left an enormous volume of data not in the macro buffer to be filled and proximity corrected. Depending on the number of UDMs in a design and the macro buffer size, the design's UDMs might not fill the Macro Buffer, thus leaving macro buffer space unused. Also, some UDMs may be used infrequently or singly in a design. Conversely, some individual shapes may be extensively repeated even though not a UDM or part of a UDM.

Reducing the data generated during the fill and proximity correction will reduce the data volume which the computer must handle and which the computer must pass to e-beam exposure control.

OBJECTS OF THE INVENTION

It is an object of the claimed invention to improve semiconductor chip fabrication with a particle beam tool.

It is another object of the claimed invention to reduce the computer processing time required to fabricate a semiconductor chip with a particle beam tool.

It is another object of the claimed invention to reduce the volume of data which is generated and must be maintained while fabricating integrated circuit chips.

It is still another object of the claimed invention to increase the number of circuits which may be placed on a semiconductor chip fabricated by particle beam lithography.

It is still another object of the claimed invention to minimize unfavorable cutting of slanted edges.

It is still another object of the claimed invention to improve conversion of circuit design shapes into particle beam lithography tool control data.

It is still another object of this invention to improve compaction of control data for particle beam lithography tools.

SUMMARY OF THE INVENTION

In accordance with the objects of this invention, a more efficient method of converting circuit design shapes into numerical control (NC) data for particle beam lithography is provided wherein design shape similarities are identified during the fill and maintained through proximity correction and e-beam exposure.

In the present invention, whenever a design shape having an angled edge is converted to Numerical Control data, at least one FILLSHAPE is generated. If the angled edge is too large, more than one FILLSHAPE is generated, by segmenting the shape into FILLSHAPEs so as to create as many identical FILLSHAPEs of a preferred size as possible. During proximity correction, each FILLSHAPE is treated as an equivalent rectangle having the same area as the FILLSHAPE. The proximity correction value for the equivalent rectangle is applied to each fill rectangle in the FILLSHAPE. A dose boost value may further be added to or subtracted from the proximity correction value for fill rectangles within the FILLSHAPE. Finally, identical FILLSHAPEs are grouped, a macro describing the fill of each unique FILLSHAPE is defined, and a summary record is created for each FILLSHAPE defined macro. When the NC data is encoded in the pattern buffer, the defined macros are placed in the macro buffer. Macro read commands pointing to defined macros in the Macro Buffer replace corresponding FILLSHAPES and User Defined Macros in the pattern buffer. The e-beam controller retrieves a user defined macro or FILLSHAPE defined Macro from the Macro buffer each time the controller encounters a Macro read command in the pattern buffer.

BRIEF DESCRIPTION OF THE DRAWINGS

While the specification concludes with claims particularly pointing out and distinctly claiming that which is regarded as the present invention, details of the preferred embodiments of the invention may be more readily ascertained from the following technical description when read in conjunction with the following drawings wherein:

FIG. 4 is an example of a shape having an angled edge and filled according to the preferred embodiment.

FIG. 6 is a pseudo code listing of how FILLSHAPES are created in accordance with the present invention.

DETAILED DESCRIPTION OF THE PREFERRED EMBODIMENT

Figure 1:
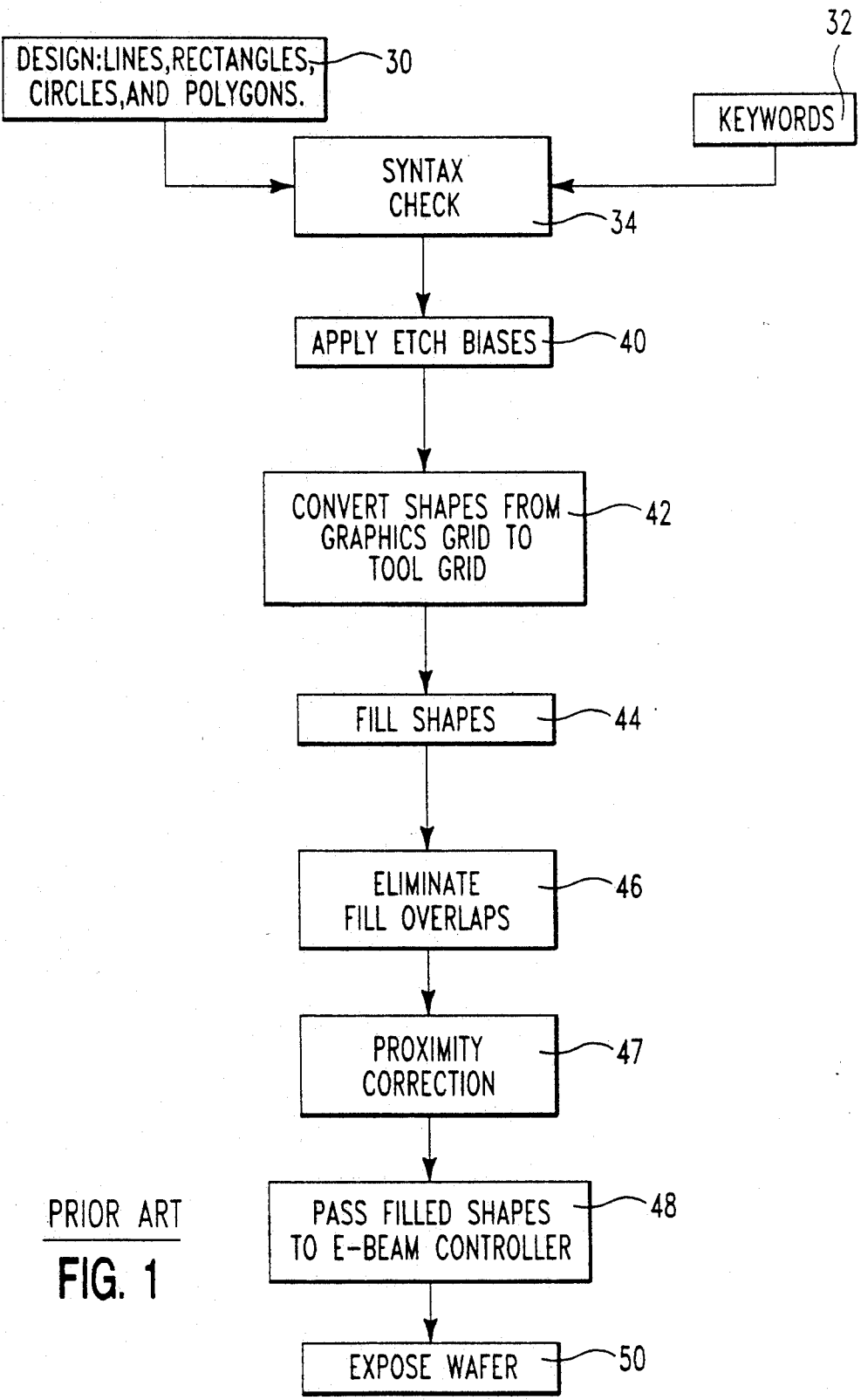
FIG. 1 is a prior art flow diagram for converting design data into e-beam tool control data.
Figure 2A:
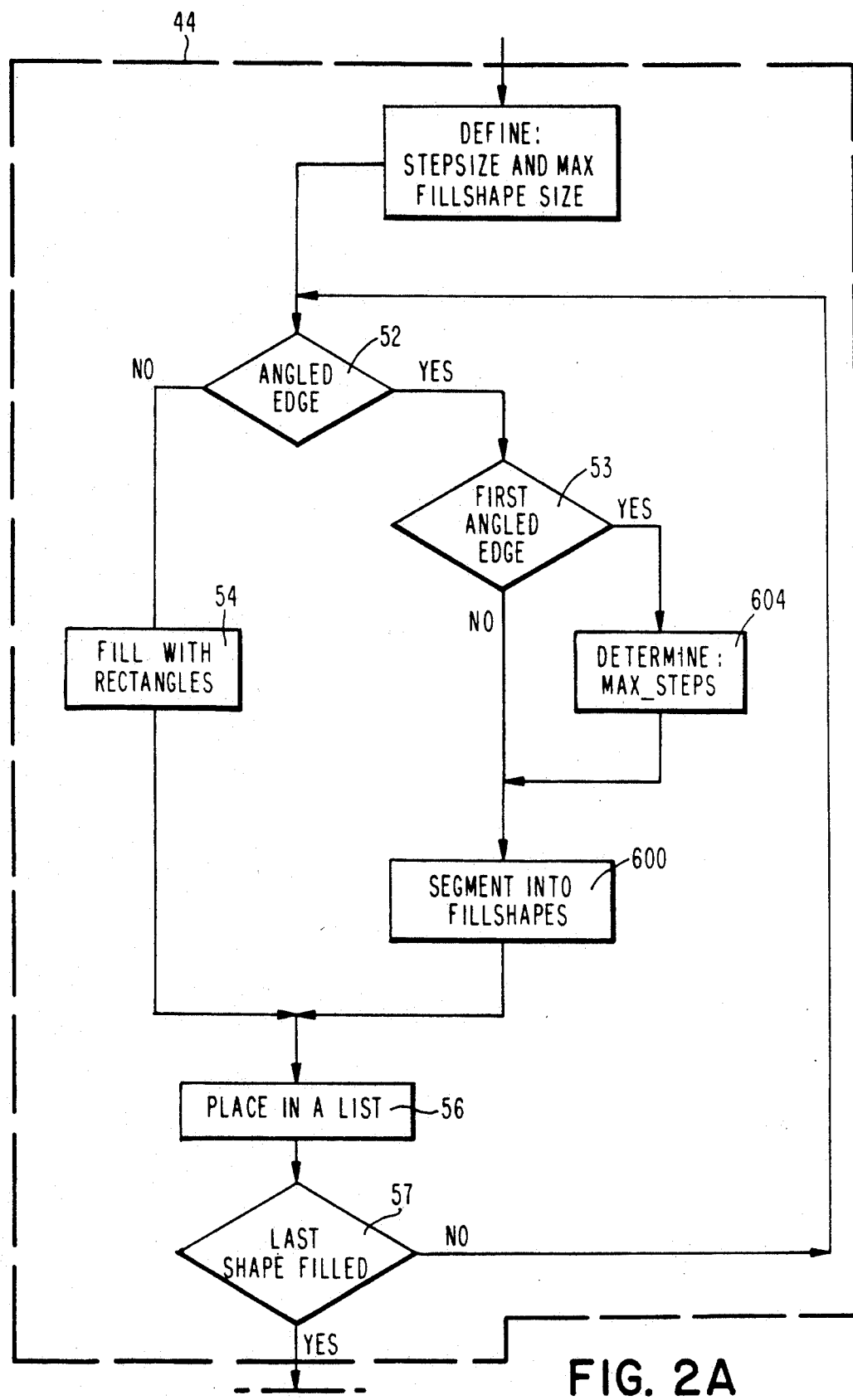
FIGS. 2A and 2B show a detailed flow diagram of the present invention.
Figure 2B:
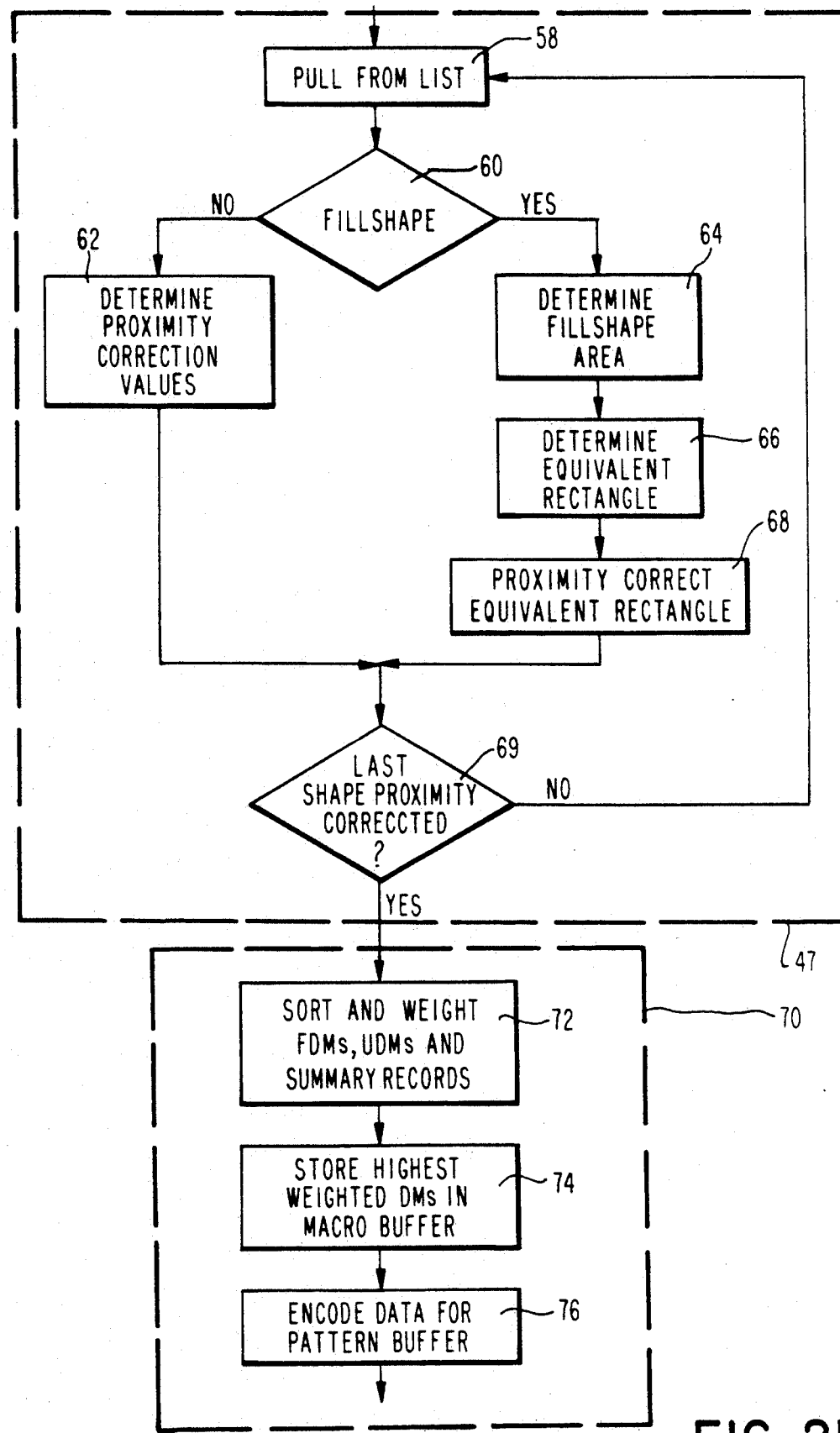
Figure 8:
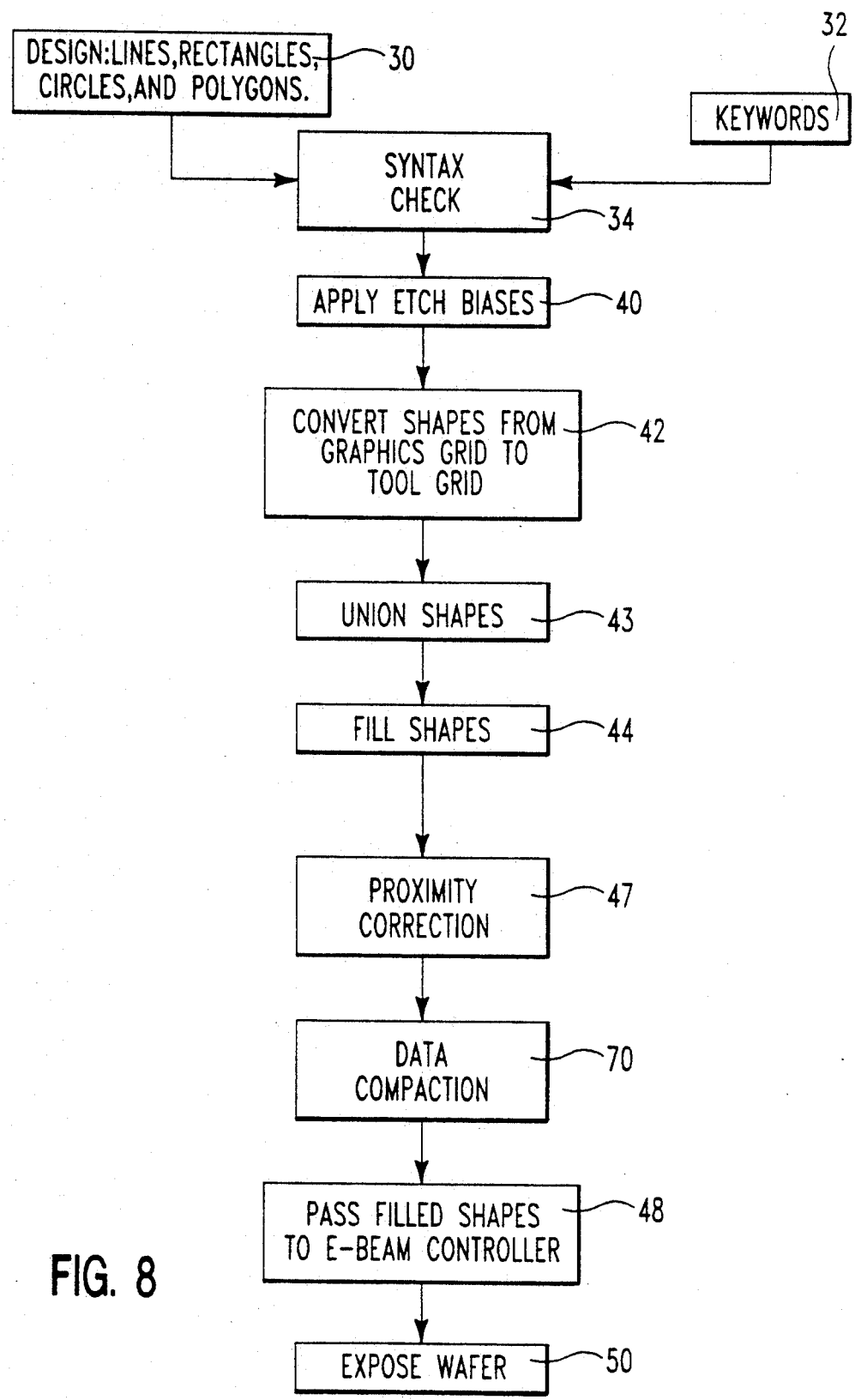
FIG. 8 is a flow diagram for converting design data into e-beam tool control data according to the present invention.

FIG. 2 is a detailed flow diagram of the present invention. FIG. 8 provides a flow diagram for converting design shapes into NC data according to the preferred embodiment of the present invention. Unlike the prior art method which included the step of eliminating fill overlaps, in the preferred embodiment, the overlapping simple shapes are combined or "unioned" (43) to form a single complex design shape. Where in the prior art method of FIG. 1, the overlaps elimination step (46) was done after filling the shapes, in the preferred embodiment the shapes are unioned (43) before the fill step (44). Additionally, the new fill step (44), new proximity correction step (47) and the new step of compacting data (70) which are provided in FIG. 2 and described in detail below are included in the preferred embodiment.

Although any method of filling design shapes (44) may be used, in the preferred embodiment, rectangular areas of design shapes are filled (54), as disclosed in U.S. Pat. No. 5,159,201 to Frei "Shape Decomposition System and Method" which is incorporated herein by reference, until a fill is to be done along an angled edge (52). When an angled edge is encountered (52), at least one FILLSHAPE (600) is created by segmenting the shape being filled along the angled edge. FILLSHAPEs have 3 or 4 sides and at least one side is part or all of the angled edge on the shape from which the FILLSHAPE was segmented. In the preferred embodiment FILLSHAPEs have edges at right angles to each other or at 45° or 135° to each other. If the shape's angled edge is short, then only one FILLSHAPE will be created, otherwise, the shape is segmented along the angled edge and more than one FILLSHAPE is created.

Creating FILLSHAPES

Although, a FILLSHAPE may be created (600) for every portion of a shape having an angled edge at any angle to the horizontal or vertical, in the preferred embodiment, FILLSHAPE's are created only for angled edges at 45° to the horizontal or vertical, i.e., 135°, 225° and 315° (hereinafter "angled edges at 45°'", "to 45°'" or "at 45°'"). Whenever an angled edge at other than 45° is encountered, a staircase is immediately generated to fill along that angled edge (54) and no FILLSHAPE is generated.

Figure 3M:
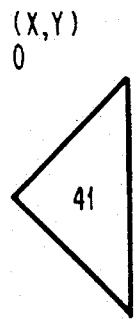
FIGS. 3A-3X are examples of FILLSHAPEs created when only 45° angles are allowed for angled edges.
Figure 3N:
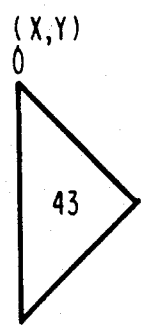
Figure 3O:
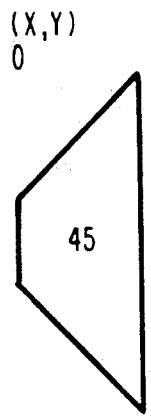
Figure 3P:
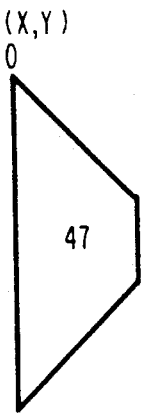
Figure 3Q:
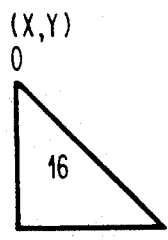
Figure 3R:
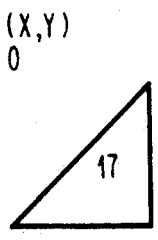
Figure 3S:
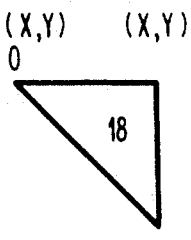
Figure 3T:
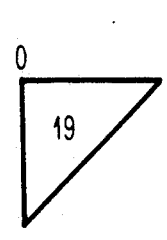
Figure 3U:
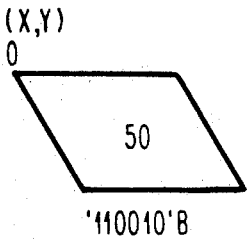
Figure 3V:
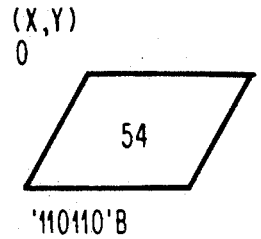
Figure 3W:
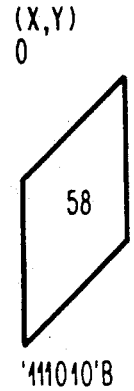
Figure 3X:
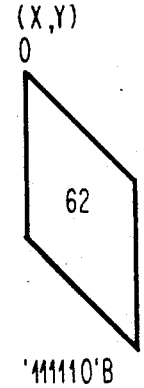

By limiting angled edges to 45°, the types of FILLSHAPEs which can be created has also been limited to a predictable set, shown in FIGS. 3A through 3X. Furthermore, because of their similarities, these FILLSHAPES can be grouped according to geometric type and assigned a tag to identify that grouping (see Table 1 below). The term "Caps" is applied to trapezoids with 2 angled edges and to triangles with 2 sides at an angle to the horizontal and vertical. "Cartesian" triangles have only one side at 45° to the horizontal and vertical. Limiting angled edges to 45° limits triangular FILLSHAPES to isosceles right triangles. With angled edges limited to 45°, both triangular cap FILLSHAPE's and Cartesian triangle FILLSHAPE are isosceles right triangles.

TABLE 1

| Geometrical Shape | Tag |
| --- | --- |
| Trapezoids | → '00'b |
| Parallelograms | → '11'b |
| Caps | → '10'b |
| Cartesian Triangles | → '01'b |

Within each geometrical group, the be classified according to: whether two sides lie in the horizontal (or x) direction or in the vertical (or y) direction, called the FILLSHAPE's orientation; whether the shape is mirrored about the vertical axis (one view of a FILLSHAPE is designated as unmirrored and its corresponding mirror image FILLSHAPE is designated as mirrored); and, whether the FILLSHAPE has been rotated about its origin by a multiple of 90° (see Table 2 below). A tag is assigned to each FILLSHAPE. A portion of the tag designates each characteristic.

TABLE 2

| Degree of Rotation | Tag |
| --- | --- |
| 0° | → '00'b |
| 90° | → '01'b |
| 180° | → '10'b |
| 270° | → '11'b |

In the preferred embodiment, each of the FILLSHAPEs in the set has a 6 bit tag wherein the first 2 bits indicate geometrical group (see Table 1), the third bit indicates orientation (0=x and 1=y orientation), the fourth bit indicates mirroring (0=unmirrored and 1=mirrored), and the fifth and sixth bit indicate rotation (see Table 2). The 6 bit tag for each FILLSHAPE in FIGS. 3A-3X is depicted in each figure below the FILLSHAPE.

Having thus categorized every possible 3 or 4-sided FILLSHAPE, any FILLSHAPE created can be completely described by its tag and the coordinates of two opposite corners of a rectangle bounding the FILLSHAPE. That rectangle is the smallest rectangle which can be placed over the FILLSHAPE and still completely enclose the FILLSHAPE. The two corners provide the FILLSHAPE's size and the tag provides any other physical features necessary to describe the FILLSHAPE. Thus, the data volume which might normally be created in the fill (44) is reduced by segmenting non-rectangular shapes into a set of simple geometrical shapes. Also, it is relatively easy to predetermine how a particular FILLSHAPE will be filled before even beginning the fill (44). Whereas in the prior art only after filling an angled edge during the fill (44) could a shape's fill be determined.

Before the fill (44), before the first angled edge is encountered (53) and before creating the first FILLSHAPE (600), the staircase size is defined by the stepsize (602) and number of steps in the staircase along the angled edge. Input parameters defined in the e-beam tool processing parameters (32) provide a preferred stepsize, a maximum stepsize, a minimum stepsize and a maximum FILLSHAPE size. The preferred stepsize is the size of the largest step that will produce desired edge smoothness. Defining the stepsize defines the staircase size because it defines the fill granularity along the angled edge.

For example, angled edge 100 in FIG. 4 might run from (0,0) at 102 to (12, 12) at 104. If the preferred step size were 3, then there would be 4 steps in the staircase.

If, however, the preferred stepsize were 4, there would be 3 steps in the staircase. For the preferred embodiment, the preferred stepsize can easily be determined from tool characteristics. Step dimensions will be in e-beam tool grid points. So a preferred stepsize will be n grid points tall, where n is an integer. For the preferred embodiment, steps n grid points high will be offset horizontally to each other by n grid points because angled edges are limited to 45° angles.

The maximum FILLSHAPE size is an input parameter defined in the e-beam tool processing parameters (32). In the preferred embodiment, the maximum FILLSHAPE size is chosen to be no larger than the maximum spot size. The spot size is the largest area the e-beam tool can expose at one time. Exposing an area larger than the maximum spot size would require that the area be fragmented into smaller areas, no larger than the maximum spot size and then, each of the fragmented areas exposed individually. The maximum FILLSHAPE size is also chosen to be the distance along a shape's exterior edge for which the proximity environment can be treated as uniform and may be determined experimentally.

Before finding the number of steps in the staircase (#steps), the number of steps in the maximum size FILLSHAPE is determined (604). The maximum number of steps (Max_steps) in a maximum FILLSHAPE (an integer), is determined (604) by dividing the defined maximum FILLSHAPE size by the stepsize. Since the maximum FILLSHAPE may not be an integral number of steps of the preferred stepsize, the stepsize may be altered in order to find a single stepsize which will produce an integral number of steps. So, the stepsize can be increased to the maximum stepsize or decreased to the minimum stepsize.

Continuing with the example of FIG. 4, if the preferred stepsize were 5, only 2 preferred steps could be placed along edge 100 with 2 grid points remaining. Either a step 2 grid points high would be added along 100 or part of 100 (2 grid points high) would remain unfilled. However, a slightly taller step of 6 or a slightly shorter step of 4 would fill along 100 with 2 steps or 3 steps respectively.

If the maximum FILLSHAPE is still not evenly divisible by an altered stepsize, then two different step sizes are used. These two step sizes will differ by only 1 e-beam tool grid point. For example, a maximum FILLSHAPE being 52 grid points tall with a preferred stepsize of 10 grid points would have staircase steps of 10, 10, 10, 11, 11. The stepsizes are chosen to be as close to the preferred stepsize as possible and to be as close to uniform in size as possible.

Figure 5:
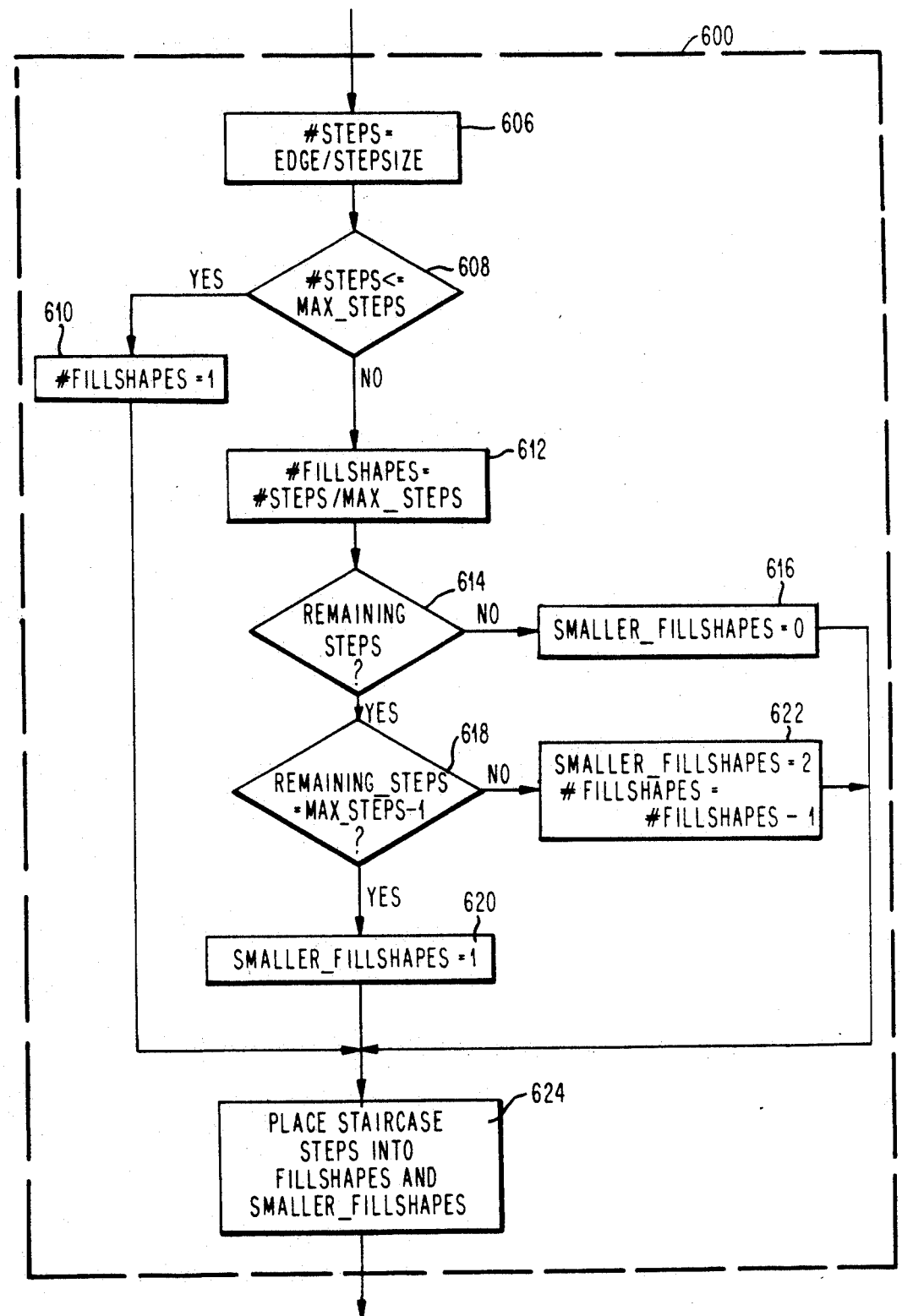
FIG. 5 is a flow diagram of how FILLSHAPEs are created in accordance with the present invention.
Figure 7A:
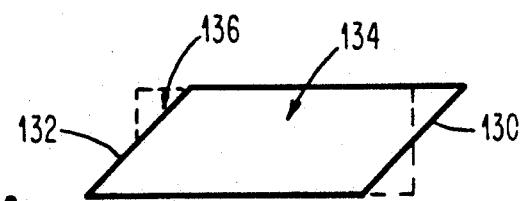
FIGS. 7A-7E are examples of equivalent rectangles created for proximity correction in accordance with the present invention.
Figure 7B:
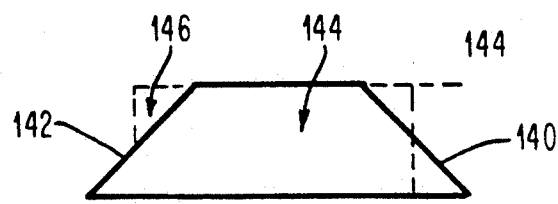
Figure 7C:
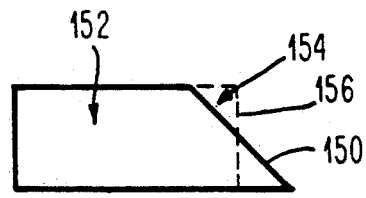
Figure 7D:
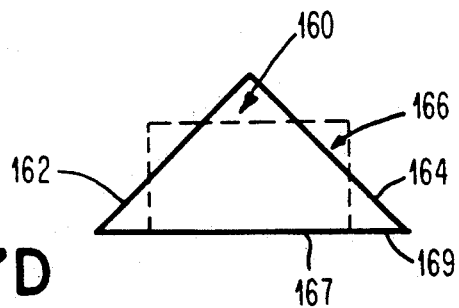
Figure 7E:
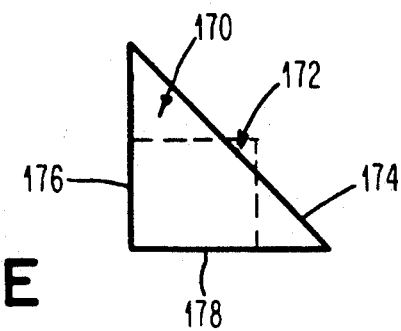

After determining Max_Steps, the first time (604) an angled edge is encountered and every time an angled edge is encountered thereafter (52 and 53), the part of the shape with the angled edge is segmented into FILLSHAPEs (600). FIG. 5 is a flow diagram of how FILLSHAPEs are created (600). The pseudo code listing of FIG. 6 is an alternate expression of how FILLSHAPEs are created (600) in the preferred embodiment. The number of steps in the edge (#steps) is determined (606) by dividing the length of the angled edge by the selected stepsize. Once the edge, FILLSHAPE and step characteristics are determined, the shape may be segmented into one or more FILLSHAPEs. Although the maximum size FILLSHAPE is the preferred size, it may be necessary to create one or two (but no more than two) smaller FILLSHAPEs. if #steps is less than or equal to Max_steps (608), a single FILLSHAPE smaller than the maximum size FILLSHAPE will be created (610).

If, however, #steps is not less than or equal to Max_steps, then more than one FILLSHAPE will be created. The number of FILLSHAPEs (#FILLSHAPES), must be determined by dividing #steps by Max_steps (612). If #steps is an integral multiple of Max_steps, then all of the FILLSHAPEs will be maximum size. If, however, #steps is not a multiple of Max_steps, then there is a remainder (of steps) when #steps is divided by Max_steps and, consequently, there will be smaller FILLSHAPEs. So, the result of 612 is checked for a remainder (614). If there is no remainder then the number of smaller FILLSHAPEs (smaller FILLSHAPES) is zero (616) and #FILLSHAPES is the #steps divided by Max_steps. If, however, there are remaining steps, then 1 or 2 smaller FILLSHAPEs are created. A single smaller FILLSHAPE is created (620) only if the number of remaining steps is one less than Max_steps (618). Otherwise, there are 2 smaller FILLSHAPEs, and #FILLSHAPES is reduced by 1 (622). If the number of remaining steps plus Max_steps is even, then the same number of steps is placed in each smaller FILLSHAPE, otherwise one smaller FILLSHAPE will have one staircase step more than the other. After determining #FILLSHAPES and smaller FILLSHAPEs, staircase steps are placed into the smaller FILLSHAPEs and FILLSHAPEs (624).

In the preferred embodiment if, as noted above, the stepsize is not uniform and 2 step sizes must be used, then the steps of each stepsize are distributed uniformly throughout the FILLSHAPEs, so that every FILLSHAPE will have the same number of each stepsize, if possible. If the 2 step sizes cannot be distributed uniformly, then they are distributed so that no FILLSHAPE has more than 1 step different than the other FILLSHAPEs. Steps are distributed throughout FILLSHAPEs to provide as uniform an edge as possible.

If a prior art fill is used for filling rectangular areas, an angled edge may be segmented unfavorably when quadrilaterals are created. That segmenting could lead to different sized FILLSHAPEs along the same angled edge. Since each of the different size quadrilaterals would be filled with its own unique staircase, the staircase along the entire angled edge might not be uniform. Thus, the angled edge's uniformity could be lost and the resulting edge might not be a straight line. Although filling along the angled edge according to the present invention would not avoid this loss of uniformity, the angled edge in each quadrilateral would still be filled more uniformly than in the prior art by creating FILLSHAPEs as set out above.

After creating FILLSHAPEs along the angled edge (600), the fill rectangles and FILLSHAPEs are placed in a list (56), and filling resumes on the rest of the design until the entire design has been filled (57). At least one FILLSHAPE is created (600) every time an angled edge is encountered (52). So, the filled design shapes consist of external rectangles (those formed along an edge), internal rectangles (those on the interior of a shape), and FILLSHAPEs. In FIG. 4, rectangles 110, 112, and 114 are external rectangles, rectangles 116 and 118 are internal rectangles and 120, 122, 124 and 126 are FILLSHAPEs.

Proximity Correction

The fill rectangles and FILLSHAPEs are passed to proximity correction (47 on FIG. 1). Each rectangle or FILLSHAPE is pulled from the list (58) and proximity corrected (47). However, proximity correction (47) in the preferred embodiment method is done differently for FILLSHAPES (60) than for external fill rectangles (62). Proximity correction (47) may not be done for internal fill rectangles with internal edges which are not critically affected by proximity effects. Whether proximity correction is done on internal fill rectangles is determined by keywords (32).

Proximity correction of each FILLSHAPE is done in the preferred embodiment by first determining the FILLSHAPE's area (64). A rectangle having an area equivalent to the FILLSHAPE is created (66). In the preferred embodiment, as depicted in FIGS. 7A-7E, paralellogram (134 in FIG. 7A) and trapezoidal (144 in FIG. 7B and 152 in FIG. 7C) FILLSHAPEs each have their angled edges (130, 132, 140, 142 and 150) bisected by the corresponding sides of their equivalent rectangle (136, 146, and 154). Equivalent rectangles 136 and 146 are centered over FILLSHAPEs 134 and 144 which each have 2 angled edges (130, 132, 140, and 142 respectively). Equivalent rectangle 154 for trapezoidal FILL-SHAPE 152, which has a single angled edge (150), is not centered over FILLSHAPE 152. Instead, the equivalent rectangle 154 shares three sides with FILL-SHAPE 152, while 154's fourth side 156 bisects angled edge 150.

The side of equivalent rectangles for triangular FILLSHAPEs (160 and 170 in FIGS. 7D and 7E) do not bisect the FILLSHAPEs' angled edges(162, 164 and 174). Equivalent rectangle 166 for cap triangle FILLSHAPE 164 is twice as wide as it is long. 166 is centered over cap triangle FILLSHAPE 160 with one of 166's wide sides (167) lying on 166's base (169) (the edge lying the X or Y direction). The equivalent rectangle for cartesian triangle FILLSHAPE 170 is square 172 with 2 sides 176 and 178, in common with the FILLSHAPE. Regardless of the geometric shape of the FILLSHAPE, the equivalent rectangle will at least partially be bordered by all of the FILLSHAPE's vertical or horizontal edges.

Once the equivalent rectangle has been created, instead of calculating proximity correction values for every fill rectangle which will fill the FILLSHAPE, a single proximity correction value is calculated for the equivalent rectangle (68). That value is the proximity correction value for the FILLSHAPE which will be applied to every fill rectangle in the FILLSHAPE. In one embodiment of the present invention, a dose boost value, is added to the proximity corrected value for smaller rectangles in the FILLSHAPE. The dose boost value, which is not a proximity correction value, increases or boosts the exposure time for very small rectangles to insure that the rectangles are written. The dose boost value is provided in the keywords (32).

A FILLSHAPE having several fill rectangles is proximity corrected in the preferred embodiment by a single proximity correction calculation (68) for every rectangle within the scattering radius of the FILL-SHAPE. The prior art would have required for each fill rectangle in the FILLSHAPE at least one calculation for each fill rectangle within its scattering radius.

Data Compaction

In the present invention, after the last shape has been proximity corrected (69), but before passing the fill data to the e-beam controller (48), the fill data is compacted (70), see FIGS. 2 and 8. FIG. 8 shows the new step of Data Compaction (70) in converting design data to NC data and exposing a semiconductor wafer. In the preferred embodiment, identical FILLSHAPEs are grouped and the groups sorted (72), stored in the macro buffer as FILLSHAPE defined macros (FDMs) (74) and replaced in the pattern buffer at each occurrence in the NC data by a macro read command which points to a FDM (76). Thus, the fill data is nested to handle repetitive FILLSHAPES more efficiently as FDMs. A level of nesting, which did not exist in the design, is added compacting the fill data by replacing several rectangles and their associated proximity correction values with a single macro read command. The more repetitive a FILLSHAPE, the more memory saving which may be realized by this data compaction. Since FILLSHAPES may also be part of the fill of a UDM, savings may also be realized in the macro buffer by replacing the FILL-SHAPES in the UDMs with macro read commands. If the macro buffer is not size limited, every unique FILL-SHAPE can have a corresponding FDM stored in the macro buffer.

However, if the e-beam tool has limited macro buffer space, there may be insufficient space in the macro buffer to store an FDM for each FILLSHAPE. When macro buffer space is limited, then a subset of all possible FDMs must be selected for storage in the macro buffer. Also, when macro buffer space is limited, it may be more efficient to remove some of the UDMs from the macro buffer in order to make more space available for frequently used FDMs. For example, a UDM could occupy a large portion of the macro buffer, but only be used once in the design whereas a single FDM might occupy less macro buffer space but be repeated extensively in the filled design. So, it might be a more efficient use of the macro buffer space and the pattern buffer space to store the FDM in the macro buffer and unnest the UDM into the pattern buffer.

Also, while an FDM is by definition repeatable for every FILLSHAPE in its corresponding group, the repeatability of a UDM is limited by the proximity environment of each occurrence of the macro. So, a single UDM, used at several locations, would not be reusable if it required different proximity correction at each location, i.e., had varying proximity environment. Conversely, UDMs having a repetitious or common proximity environment may be represented by a single UDM in the macro buffer. So, whether a UDM in the macro buffer can be used for every occurrence of the same macro depends on whether there is a common environment for every occurrence.

Figure 9:
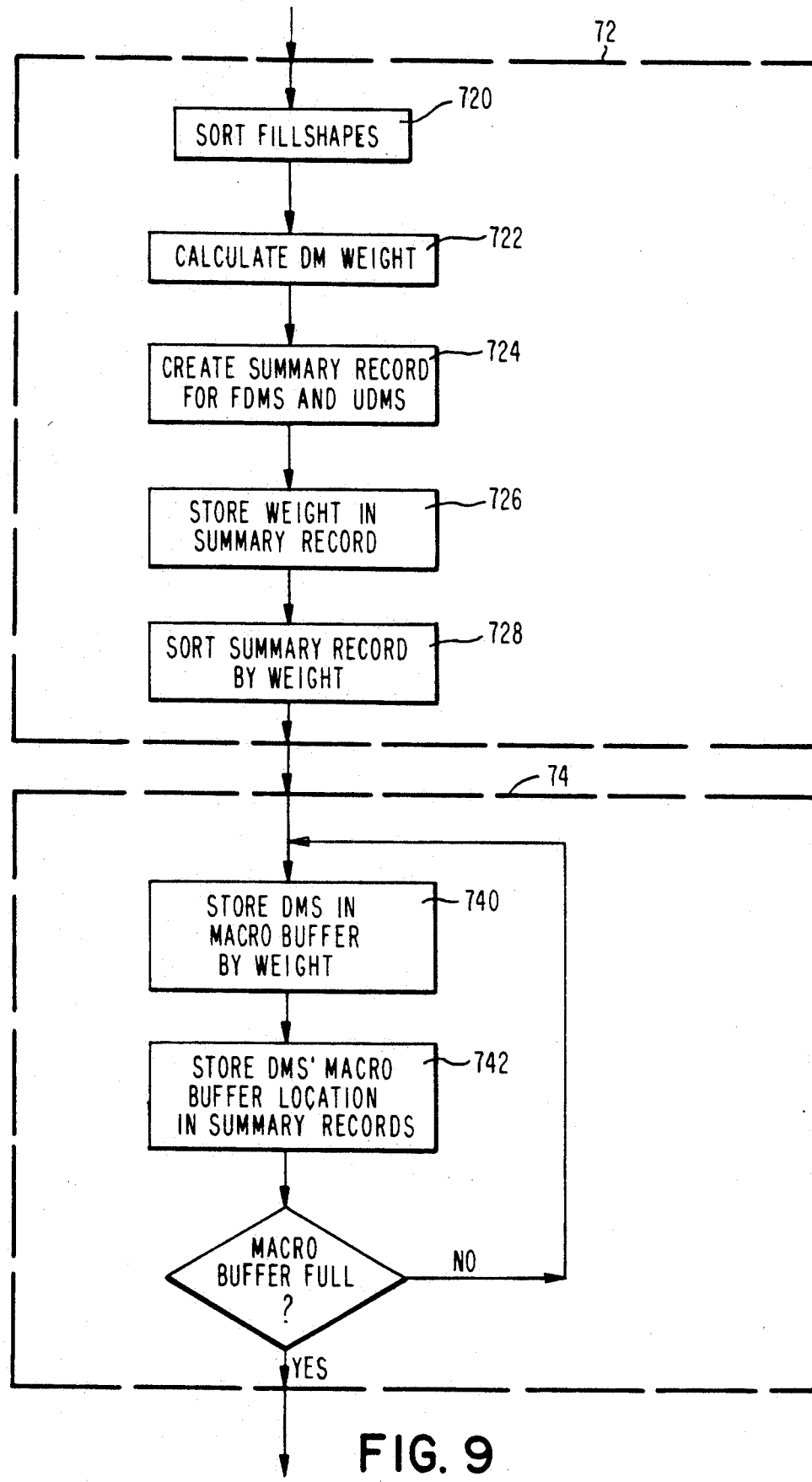
FIG. 9 is a flow diagram of how Filldata is compacted in one embodiment of the present invention.

In one embodiment of the present invention, whichever UDMs and FILLSHAPEs that are most frequently repeated after proximity correction (47) and which, therefore, provide the most efficient use of the macro buffer are selected for storage in the macro buffer first (74). Consequently, even if all UDMs and FDMs will not fit in the macro buffer, the most efficient use is made of the macro buffer, see FIG. 9. When used below DMs refers to UDMs and FDMs.

In selecting DMs for the macro buffer, first, FILL-SHAPEs are sorted (720). The sort criteria of is:

1) type—the 24 FILLSHAPEs of the preferred embodiment in FIGS. 5A-5X are sorted in ascending order according to their 6 bit binary tags;
2) width—in ascending order from narrowest to widest;
3) height—in ascending order from shortest to tallest; and
4) exposure—in ascending order from lightest to heaviest.

As a result of sorting, like FILLSHAPEs will be grouped together. After sorting, a weight value is calculated (722), providing a guide for selecting DMs for storage in the macro buffer.

The WEIGHT of a DM, which represents the amount of pattern buffer saved by coding the DM in the macro buffer once, is: the number of data bytes by which the DM exceeds the macro read command, multiplied by the number of times the DM occurs in the design, and divided by the space required to store the DM in the macro buffer. A DM's weight is defined by:

$$WEIGHT = ((\#rect\_bytes + expos\_bytes - length\ (macro\ read\ command)) * \#\_occurrences)/(\#bytes\_required)$$

Where:
rect_bytes: number of rectangles generated when FILLSHAPE is expanded times the length (rectangle command);
expos_bytes: number of different exposures on the rectangles within the FILLSHAPE expansion times the length (exposure command);
length (macro read command): number of bytes it takes to code a macro read command within the pattern buffer;
_occurrences: number of occurrences this FILLSHAPE is found within the design; and
bytes_required: to code the FILLSHAPE in macro buffer.

After calculating the weight of all DMs, a summary record is created for each unique DM (724) and the weight is placed in the summary record (726). Optionally, FILLSHAPES having a common type height and width, but slightly different exposure values may be combined or merged to further compact data. Combining FILLSHAPES with different exposure values such as this is called Dose Merge. The magnitude of the difference in dose between two DMs which may be merged is defined in the Keywords (32). In the preferred embodiment FILLSHAPES with different exposure values are not merged.

Once a summary record has been created for each unique DM, the summary records are sorted according to weight in descending order (728). After the sort (728), the summary record for the highest weighted DM, the DM which, if stored in the macro buffer, will provide the most pattern buffer saving, will be first. Starting with the first sorted summary record, (the summary record with the highest weight), the DM which corresponds to each summary record is stored in a buffer (740) or portion of memory in the computer which represents the macro buffer. Alternatively, the DM could be stored in the e-beam tool's macro buffer. However, in the preferred embodiment all NC data which is to ultimately be stored in the e-beam controller's macro buffer, is temporarily stored in the computer's buffer (740). Since all of the (macro) NC data stored in the computer's buffer will be transferred to the e-beam controller's macro buffer (48), both of these buffers are interchangeably referred to as the macro buffer. It should be understood, however, that in the preferred embodiment, before the macro NC data is transferred to the e-beam controller's macro buffer (48), the term macro buffer refers to the computer's buffer.

As each DM is placed in the macro buffer, the location (address) and amount of macro buffer storage (size) used in storing the DM is added to the summary record (742). DMs are stored in the macro buffer (740) and the address and size of storage are added to the summary record (742) for each sorted summary record until the macro buffer is full, or, until every DM with a weight greater than zero has been stored in the macro buffer. In the preferred embodiment, when the DM's weight is 0, no pattern buffer is saved by storing the DM in the macro buffer, because 0 is the storage break even point, the point where the DM is the same size as a macro read command. Although a weight of 0 is the break even point for data volume, it requires additional data handling and so, actually, slows tool operation. Alternatively, DM's with a weight equal to zero may be stored in the macro buffer. However, DM's with a negative weight represent an increase in data volume and are not stored in the macro buffer.

Figure 10:
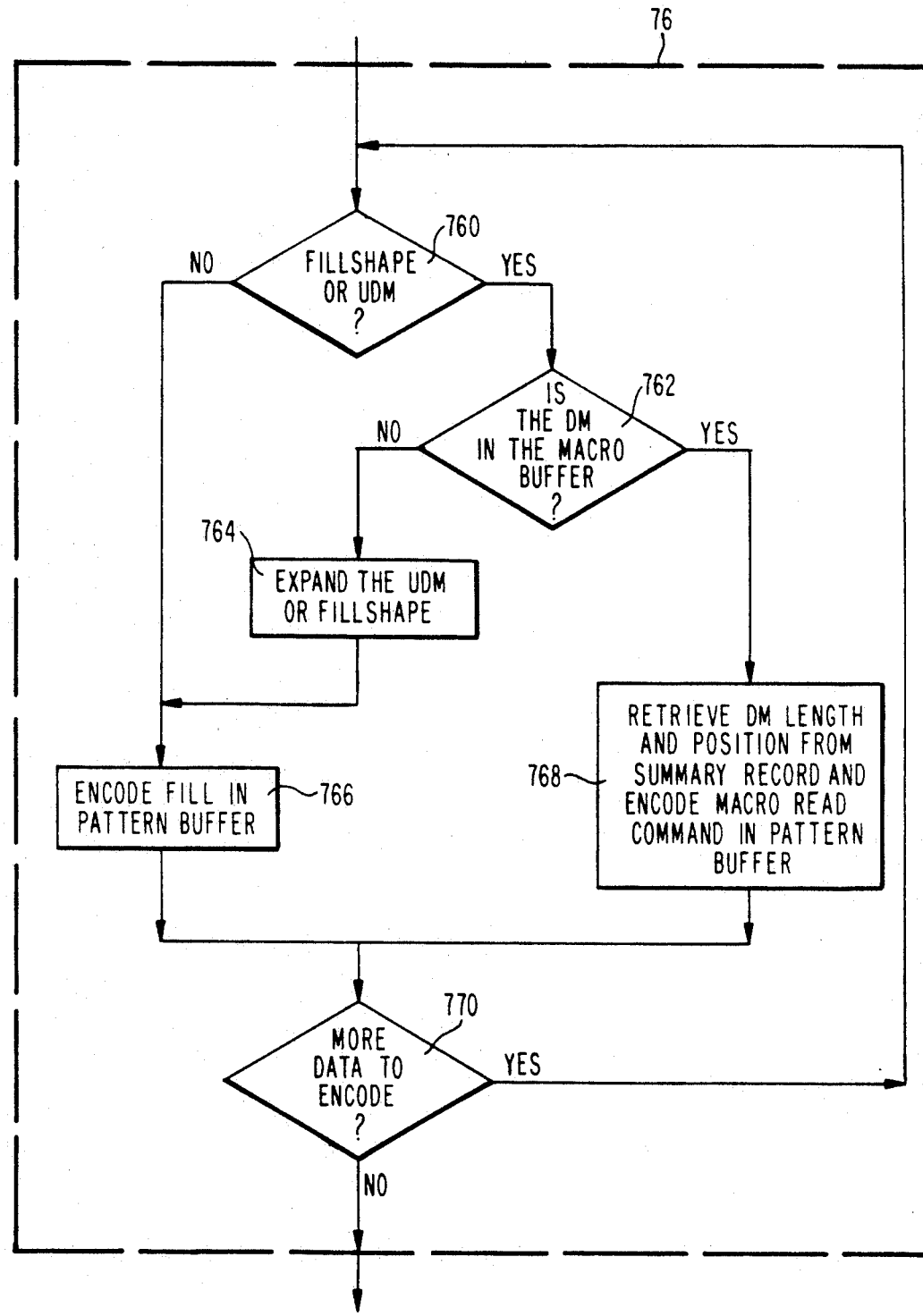
FIG. 10 is a flow diagram of how Filldata is encoded as numerical control data to control an electron beam exposure tool in one embodiment of the present invention.

After filling the macro-buffer, the NC data is encoded (76) for the pattern buffer by converting the filled and proximity corrected shape records for the design from fill rectangles, FILLSHAPEs, and macro read commands (for UDMs) to e-beam tool control commands (NC data) and macro read commands (for DMs in the macro buffer) see FIG. 10. Each fill rectangle is converted to NC data for the pattern buffer until a FILLSHAPE or UDM is encountered (760). In the preferred embodiment the macro buffer size is unlimited and a DM is stored in the macro buffer for every FILLSHAPE or UDM with a weight greater than 0. However, if macro buffer space is limited, a determination must be made of whether the UDM or FILLSHAPE has been encoded as a DM in the macro buffer (762). If not, then the FILLSHAPE or UDM is expanded (764) and directly encoded as NC data in the pattern buffer (766). If the DM has been encoded in the macro buffer (766), then a Macro Read Command is issued (768) to extract the position and length of the macro from the summary record. When the e-beam tool executes this macro read command, it first extracts the macro position and length from the summary record, retrieves the DM from the macro buffer and then executes the extracted DM.

Data encoding continues until all of the data has been encoded (770) as NC data or macro read commands for the pattern buffer. The filled shapes thus having been encoded as NC data are passed to the e-beam controller (48) pattern buffer and the DM's are passed to the e-beam controller macro buffer for exposing the pattern on a semiconductor wafer (50).

While what is considered to be the preferred embodiments of the invention are herein described, variations and modifications thereof will occur to those skilled in the art. Therefore, it is intended that the appended claims shall be construed to include the preferred embodiments and all such variations and modifications in form and detail that fall within the spirit and scope of the invention.

We claim:

1. A system for generating control data for controlling a particle beam tool comprising:

decomposing means for decomposing a plurality of design shapes into a plurality of fill rectangles and FILLSHAPEs;

sorting means for sorting said FILLSHAPEs into groups and for defining a macro for each said group;

storing means for storing each said defined macro into a macro buffer; and encoding means for encoding as control data said defined macros and said fill rectangles.

2. The system of claim 1 further comprising:
proximity correction means for determining a proximity correction value; and,
means for determining an equivalent rectangle for said FILLSHAPEs.

3. The system of claim 1 further comprising exposing means for exposing a radiation sensitive layer.

4. The system of claim 1 further comprising means for retrieving a plurality of user defined macros from said macro buffer, and, wherein said defined macros stored into said macro buffer by said storing means includes at least one of said user defined macros.

5. The system of claim 4 further comprising weighting means for placing a weight for each said defined macro into a corresponding summary record.

6. The system of claim 5 further comprising means for sorting said summary records according to said weight.

7. The system of claim 6 wherein said storing means further comprises means for selecting said defined macros for storage according to said weight.

8. The system of claim 1 wherein a plurality of said design shapes are angled shapes having at least one angled edge and said decomposing means comprises segmenting means for segmenting each said angled shape along its angled edge into a plurality of FILLSHAPEs.

9. The system of claim 8 wherein the segmenting means comprises:
means for determining a step size; and
means for determining a staircase and a staircase size.

10. The system of claim 9 wherein the segmenting means further comprises:
means for determining a FILLSHAPE number, and a smaller FILLSHAPE number; and
means for dividing said staircase between said FILLSHAPEs and said smaller FILLSHAPEs.

11. A method of controlling a particle beam tool to expose a radiation sensitive layer to a plurality of design shapes, said method comprising the steps of:
decomposing said shapes into a plurality of fill rectangles and FILLSHAPEs;
sorting said FILLSHAPEs into groups;
placing a FILLSHAPE defined macro into a macro buffer for at least one said group; and
exposing said radiation sensitive layer by said particle beam tool according to said FILLSHAPE defined macro.

12. The method of controlling a particle beam tool of claim 11 wherein a plurality of said design shapes are angled shapes having at least one angled edge, said decomposing step comprising the steps of:
defining a maximum FILLSHAPE size; and
segmenting at least one said angled shape along its said angled edge into a plurality of FILLSHAPEs.

13. The method of controlling a particle beam tool of claim 12 wherein the plurality of FILLSHAPEs further comprises at least one said maximum FILLSHAPE and at least one smaller FILLSHAPE.

14. The method of controlling a particle beam tool of claim 12 wherein the plurality of FILLSHAPEs further comprises at least one said maximum FILLSHAPE and 2 smaller FILLSHAPEs.

15. The method of controlling a particle beam tool to expose a radiation sensitive layer of claim 11 further comprising the step of encoding said two-dimensional shapes in a pattern buffer comprising the steps of:
encoding in said pattern buffer, said fill rectangles as Numerical Control data;
and encoding a macro read command in said pattern buffer for said FILLSHAPE defined macros.

16. The method of controlling a particle beam tool to expose a radiation sensitive layer of claim 11 further comprising the steps of:
retrieving a plurality of user defined macros;
sorting said user defined macros; and
exposing said radiation sensitive layer according to said user defined macros.

17. The method of controlling a particle beam tool to expose a radiation sensitive layer of claim 16 further comprising the steps of:
generating a summary record for each said group of FILLSHAPEs and for each said user defined macros;
determining a weight for each said group; and
storing said weight in said summary record.

18. The method of controlling a particle beam tool to expose a radiation sensitive layer of claim 17 further comprising the step of sorting said summary records according to said weight.

19. The method of controlling a particle beam tool to expose a radiation sensitive layer of claim 18 wherein the placing step further comprises placing said FILLSHAPE defined macros and user defined macros in said macro buffer in the order of said sorted summary record.

20. The method of controlling a particle beam tool to expose a radiation sensitive layer of claim 19 wherein the placing step further comprises placing every said FILLSHAPE defined macro and every said user defined macro with at least a minimum said weight in the macro buffer.

21. The method of controlling a particle beam tool to expose a radiation sensitive layer of claim 20 further comprising the steps of encoding numerical control data for a pattern buffer comprising the steps of:
encoding said fill rectangles as numerical control data;
encoding a macro read command for all FILLSHAPEs and user defined macros in said macro buffer; and
filling with rectangles every FILLSHAPE defined macro and user defined macro below said minimum weight and encoding said rectangles as numerical control data.

22. A method of shape decomposition for decomposing a two dimensional shape having at least one angled edge, said method comprising the steps of:
determining a step size;
determining a Maximum FILLSHAPE size;
determining a staircase size, said staircase size being the length of the angled edge divided by the step size;
determining a FILLSHAPE number, said FILLSHAPE number being the staircase size divided by the Maximum FILLSHAPE size; and
segmenting said shape into at least 1 FILLSHAPE.

23. The method of shape decomposition of claim 22 wherein said shape is segmented into a plurality of maximum size FILLSHAPEs whereby the number of Maximum size FILLSHAPEs is the FILLSHAPE number.

24. The method of shape decomposition of claim 22 wherein said shape is segmented into at least one Maximum size FILLSHAPE and at least one smaller FILLSHAPE, whereby the number of Maximum size FILLSHAPEs is the FILLSHAPE number.

25. The method of shape decomposition of claim 22 wherein said shape is segmented into at least one Maximum size FILLSHAPE and 2 smaller FILLSHAPEs, whereby the number of Maximum size FILLSHAPEs is less than said FILLSHAPE number.

26. A method of controlling a particle beam tool for exposing a radiation sensitive layer to a design shape, said design shape having at least one angled edge, said method comprising the steps of:
   filling said design shape with fill rectangles and at least one FILLSHAPE;
   determining an equivalent rectangle for each said FILLSHAPE;
   determining a proximity correction value for each said equivalent rectangle;
   applying each said proximity correction value to each said FILLSHAPE; and
   exposing said radiation sensitive layer by said particle beam tool according to said applied proximity correction value.

27. The method of controlling a particle beam tool for exposing a radiation sensitive layer of claim 26 wherein a side of said equivalent rectangle bisects said FILLSHAPE's angled edge.

28. The method of controlling a particle beam tool for exposing a radiation sensitive layer of claim 26 wherein said FILLSHAPE is triangular and said equivalent rectangle is square.

29. The method of controlling a particle beam tool for exposing a radiation sensitive layer of claim 26 wherein said FILLSHAPE is triangular and a first side of said equivalent rectangle is twice a second side.

30. The method of controlling a particle beam tool for exposing a radiation sensitive layer of claim 26 wherein the equivalent proximity correction value is increased for at least one small fill rectangle in said FILLSHAPE.

31. A method of generating control data for controlling the exposure of a radiation sensitive layer to a plurality of two dimensional shapes comprised of a plurality of angled shapes, said angled shapes having at least one angled edge, said method comprising the steps of:
   decomposing said angled shapes into a plurality of fill rectangles and a plurality of FILLSHAPEs, said FILLSHAPEs being 3-sided FILLSHAPEs and 4-sides FILLSHAPEs, at least one said side on each said FILLSHAPE lying on an angled shape's angled edge;
   determining a proximity correction exposure value for each said FILLSHAPE by the steps of determining an equivalent rectangle for each said FILLSHAPE, and determining an equivalent proximity correction value for said equivalent rectangle;
   grouping identical said FILLSHAPEs into a plurality of groups, each said group consisting of at least one FILLSHAPE; and
   placing a FILLSHAPE defined macro in a macro buffer for each said FILLSHAPE group, said FILLSHAPE defined macro being encoded as control data and retrieved from said macro buffer to expose each said FILLSHAPE in said group.

32. The method of exposing a radiation sensitive layer of claim 31 wherein the decomposing step comprises the steps of:
   determining a maximum FILLSHAPE size; and segmenting at least one said angled shape along its angled edge into a plurality of maximum size FILLSHAPEs.

33. The method of exposing a radiation sensitive layer of claim 31 wherein the decomposing step further comprises the step of segmenting at least one said angled shape along its angled edge into at least one maximum size FILLSHAPE and at least 1 smaller FILLSHAPE.

34. The method of exposing a radiation sensitive layer of claim 31 wherein the decomposing step further comprises the step of segmenting at least one said angled shape along its angled edges into at least one maximum size FILLSHAPE and 2 smaller FILLSHAPES.

35. The method of exposing a radiation sensitive layer of claim 31 wherein a side of at least one said equivalent rectangle bisects at least one said FILLSHAPE's angled edge.

36. The method of exposing a radiation sensitive layer of claim 31 wherein at least one said FILLSHAPE is triangular and its equivalent rectangle is square.

37. The method of exposing a radiation sensitive layer of claim 31 wherein at least one said FILLSHAPE is triangular and a first side of its equivalent rectangle is twice a second side.

38. The method of exposing a radiation sensitive layer of claim 31 wherein the exposure determination step further comprises increasing the equivalent proximity correction value for a small fill rectangle in at least one said FILLSHAPE.

39. The method of exposing a radiation sensitive layer of claim 31 wherein the placing step comprises the steps of:
   generating a summary record for each said group of FILLSHAPEs;
   determining a weight for each said group; and
   storing said weight in said summary record.

40. The method of exposing a radiation sensitive layer of claim 39 wherein the placing step further comprises the step of sorting said summary records according to said weight.

41. The method of exposing a radiation sensitive layer of claim 40 wherein the placing step further comprises placing each said FILLSHAPE defined macro in the macro buffer in the order of its said sorted summary record.

42. The method of exposing a radiation sensitive layer of claim 41 further comprising the step of encoding said two dimensional shapes in a pattern buffer said encoding step comprising the steps of:
   encoding said fill rectangles as Numerical Control data; and
   encoding a macro read command for said FILLSHAPEs.

43. The method of exposing a radiation sensitive layer of claim 41 wherein FILLSHAPE defined macros are placed in the macro buffer for all said FILLSHAPEs with at least a minimum weight.

44. The method of exposing a radiation sensitive layer of claim 43 further comprising the steps of encoding numerical control data for a pattern buffer comprising the steps of:

encoding said fill rectangles as numerical control data;

issuing a macro read command for each FILLSHAPE defined macro; and filling with rectangles and encoding said rectangles every FILLSHAPE below said minimum weight factor.

45. The method of exposing a radiation sensitive layer of claim 41 further comprising the step of combining at least two groups of FILLSHAPEs having different exposure values into a single group.

* * * * *